United States Patent [19]

McMinn

[11] Patent Number: 5,077,692
[45] Date of Patent: Dec. 31, 1991

[54] INFORMATION STORAGE DEVICE WITH BATCH SELECT CAPABILITY

[75] Inventor: Brian D. McMinn, Austin, Tex.

[73] Assignee: Advanced Micro Devices, Inc., Sunnyvale, Calif.

[21] Appl. No.: 489,203

[22] Filed: Mar. 5, 1990

[51] Int. Cl.$^5$ ............................ G11C 7/00; G11C 11/407
[52] U.S. Cl. ............................ 365/230.06; 365/189.08; 365/189.01; 365/230.01
[58] Field of Search ............................ 365/230.06, 189.08, 365/230.01, 189.01

[56] References Cited

U.S. PATENT DOCUMENTS

| | | | |
|---|---|---|---|
| 4,660,178 | 4/1987 | Hardee et al. | 365/230.06 |
| 4,731,761 | 3/1988 | Kobayashi | 365/230.06 |
| 4,748,597 | 5/1988 | Saito et al. | 365/189.08 |
| 4,905,195 | 2/1990 | Fukuda et al. | 365/230.06 X |

Primary Examiner—Alyssa H. Bowler
Attorney, Agent, or Firm—Foley & Lardner

[57] ABSTRACT

An apparatus which has storage cells arrayed in a matrix having rows and columns. The apparatus includes row select lines for effecting selection of a first array of the storage cells, and column designation lines for effecting selection of at least one specific storage cell among the selected first array of storage cells. Read lines for enabling reading of the contents of the various storage cells are included, as well as an interface circuit associated with each storage cell for effecting operative connection of respective storage cells to appropriate respective read lines. The interface circuits are selectively operatively connected to the row select lines and the column designation lines according to a predetermined arrangement.

13 Claims, 3 Drawing Sheets

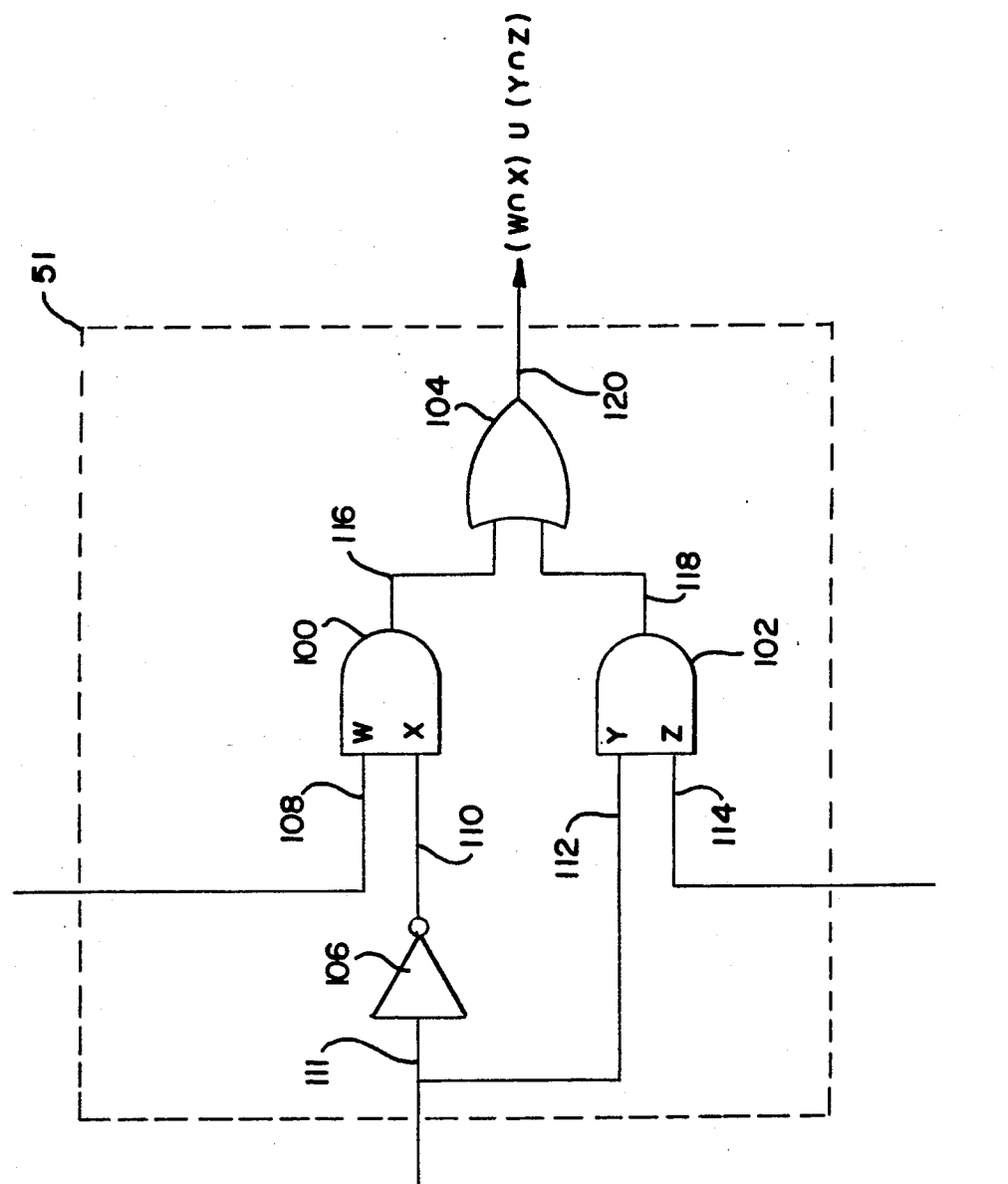

INFORMATION STORAGE DEVICE WITH BATCH SELECT CAPABILITY

BACKGROUND OF THE INVENTION

The present invention is directed to an apparatus which is adaptable for use as an information storage device. In particular, the preferred embodiment of the present invention is useful as a data storage device for a superscalar computing apparatus.

A superscalar computing apparatus is a computing apparatus which executes more than one instruction per clock cycle. In achieving that level of operational efficiency, it is desirable that the instructions to be executed by the computing apparatus be stored in a data storage device and fetched from the data storage device in groups, or fetch-batches. That is, when the apparatus is interrogated, more than one instruction is fetched at a time so that the instructions may be queued and ready for execution by the computing apparatus, thus ensuring that inefficiencies in operation of the computing apparatus are not occasioned by lack of an available instruction for execution.

For example, in prior art devices utilized in such superscalar applications, a fetch-batch of four instructions may be fetched at a time. Such prior art data storage devices have an array of storage cells arranged in rows of four cells each with the cells in the respective rows being arranged in columns. A matrix of storage cells is thus presented consisting of four columns and n rows, with n depending upon various parameters such as computation speed, fetch speed, and the like.

Read lines are associated with each column, and operative connection of a respective cell within a column with its associated read lines enables fetching of the instruction stored within that particular cell.

In such prior art devices, only one row at a time is selectable. Therefore, if it is required that an instruction set (i.e., a four-instruction fetch-batch) begins at a column other than the first column, fetching will begin with the designated beginning second, third, or fourth column, and the remainder of that particular row of instructions is fetched. With such an arrangement, instructions in columns within the selected row which precede the designated beginning column are "thrown away". Thus, the full four-instruction fetch capability is not efficiently utilized and fetchable instructions within the selected row are wasted.

The present invention allows selective designation of particular cells in more than one row within a matrix and, in the preferred embodiment, provides for fetching of a fetch-batch of four consecutive instructions no matter which column the first designated instruction occupies. Thus, the present invention presents no architectural limitation to full employment of the fetch capability of the superscalar computing apparatus without wasting instructions.

SUMMARY OF THE INVENTION

The invention is an apparatus adaptable for use as an information storage device which has a plurality of storage cells. The storage cells are arrayed in a matrix having rows and columns. The apparatus includes a plurality of first select lines, or row select lines, for effecting a first selection of a first array of the plurality of storage cells, and a plurality of second select lines, or column designation lines, for effecting a second selection of at least one specific storage cell among the first array of the plurality of storage cells. A plurality of read lines for enabling reading of the contents of the various storage cells is also included, as well as a plurality of interface circuits for effecting operative connection of specific storage cells to appropriate respective read lines. The interface circuits are selectively operatively connected to the row select lines and the column designation lines according to a predetermined arrangement.

In the preferred embodiment of the present invention, each of the storage cells has an address which is expressed as a plurality of binary address bits. The first selection by the row select lines is determined by the higher order address bits and the second selection by the column designation lines is determined by the lower order address bits.

Preferably, each storage cell has an associated respective interface circuit. Each interface circuit comprises two AND gates and an OR gate. Each of the two AND gates receives one input from different ones of the plurality of row select lines and another input from different ones of the plurality of column designation lines. The OR gate receives as its two inputs the outputs of the two AND gates; the output of the OR gate is operatively connected to effect the connection of the associated storage cell to its appropriate read lines.

The address of a specific storage cell associated with a respective instruction establishes, by predetermined arrangement, the appropriate row select lines and column designation lines which identify the specific storage cell and effect its connection to its respective read lines. By the aforesaid predetermined arrangement, any one of the storage cells within a given row in the matrix may be a beginning storage cell of a four cell fetch-batch. The predetermined arrangement ensures that the next three succeeding storage cells, regardless of the row in which those storage cells are located, are included in the fetch-batch, thereby ensuring that each interrogation of the apparatus yields a fetch-batch comprising the information contained within four storage cells.

It is, therefore, an object of the present invention to provide an apparatus adaptable for use as an information storage device which ensures that a full fetch-batch of instructions is obtained by each interrogation of the apparatus.

A further object of the present invention is to provide an apparatus adaptable for use as an information storage device wherein the fetch-batch yielded by an interrogation of the apparatus is predetermined according to the address of the beginning storage cell of the fetch-batch.

Further objects and features of the present invention will be apparent from the following specification and claims when considered in connection with the accompanying drawings illustrating the preferred embodiment of the invention.

DETAILED DESCRIPTION OF THE DRAWINGS

FIG. 3 is an electrical schematic diagram of an alternate embodiment of the interface circuit of the present invention.

DETAILED DESCRIPTION OF THE INVENTION

Figure 1:
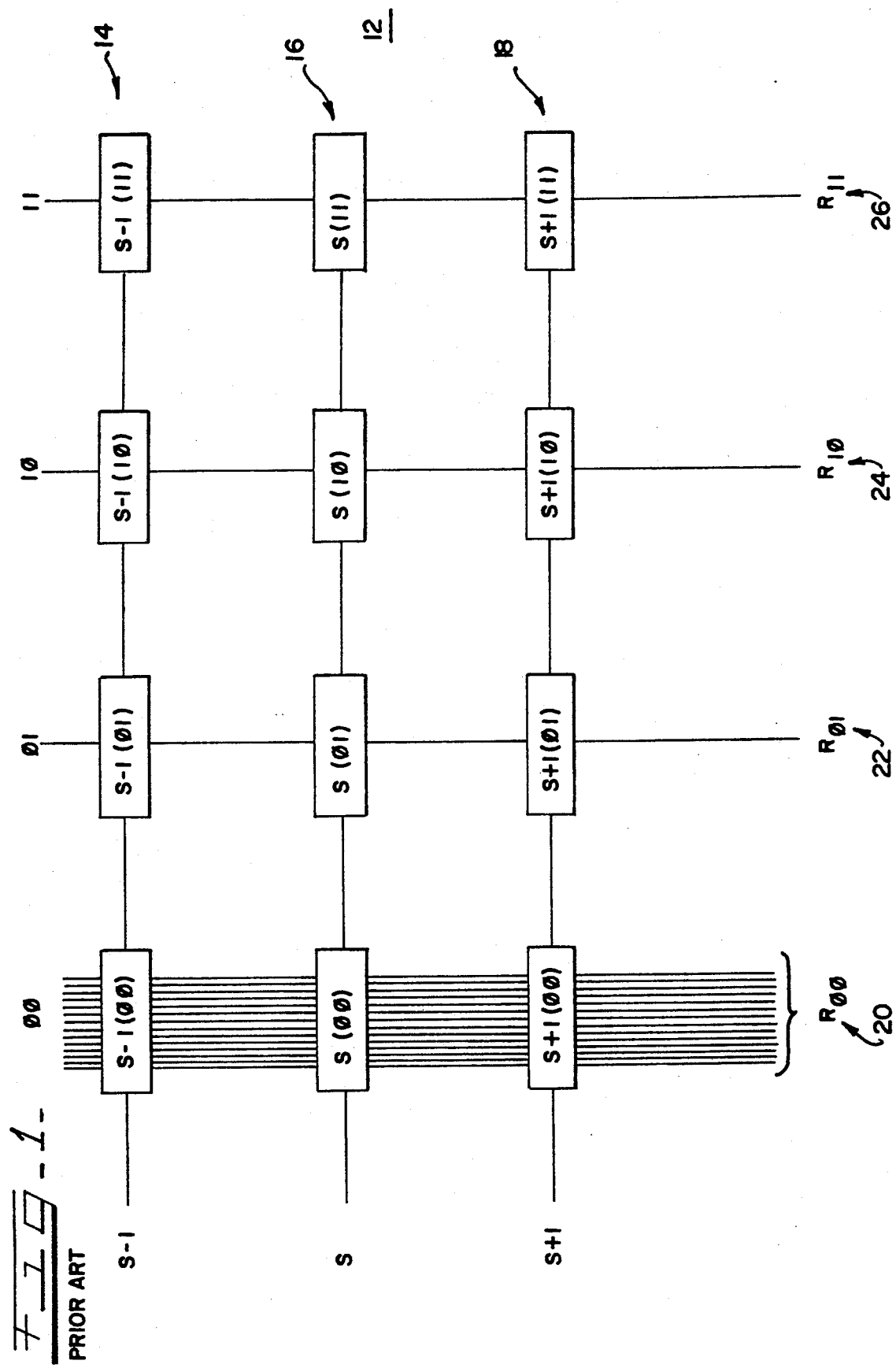
FIG. 1 is an electrical schematic drawing of a prior art storage device commonly used in superscalar computing apparata.

FIG. 1 is an electrical schematic diagram of a prior art storage device commonly used in a superscalar computing apparatus. In FIG. 1, a storage device 12 is shown having a matrix construction comprising rows 14, 16, 18, and columns 20, 22, 24, 26. Select lines are associated with each row so that select line S−1 is associated with row 14, select line S is associated with row 16, and select line S+1 is associated with row 18.

At each row, column intersection, there is situated a storage cell, each of which storage cells is identified by an address comprised of a plurality of binary bits. The bits of each respective storage cell address are arranged in order of significance and the columns 20, 22, 24, 26 represent an arrangement of respective storage cells according to the two least-significant bits of their respective addresses. Thus, column 20 is associated with storage cells having an address with its two least-significant bits being $\emptyset\emptyset$, column 22 is associated with storage cells having an address with its two least-significant bits being $\emptyset 1$, column 24 is associated with storage cells having an address with its two least-significant bits being $1\emptyset$ and column 26 is associated with storage cells having an address with its two least-significant bits being 11.

Accordingly, each respective storage cell may be identified by its select line and the two least-significant bits of its address: column 20 contains storage cells S−1($\emptyset\emptyset$), S($\emptyset\emptyset$), and S+1($\emptyset\emptyset$); column 22 contains storage cells S−1($\emptyset 1$), S($\emptyset 1$), and S+1($\emptyset 1$); column 24 contains storage cells S−1($1\emptyset$), S($1\emptyset$), and S+1($1\emptyset$); and column 26 contains storage cells S−1(11), S(11), and S+1(11).

Read lines $R_{\emptyset\emptyset}$, $R_{\emptyset 1}$, $R_{1\emptyset}$, and $R_{11}$ are, respectively, associated with columns 20, 22, 24, 26 so that read line $R_{\emptyset\emptyset}$ may read any of the storage cells having an address with its two least-significant bits being $\emptyset\emptyset$, read line $R_{\emptyset 1}$ may read the contents of any of the storage cells having an address with its two least-significant bits being $\emptyset 1$, read line $R_{1\emptyset}$ may read the contents of any of the storage cells having an address with its two least-significant bits being $1\emptyset$, and read line $R_{11}$ may read the contents of any of the storage cells having an address with its two least-significant bits being 11. The determination as to which storage cell in a given column 20, 22, 24, 26 is read by a respective read line $R_{\emptyset\emptyset}$, $R_{\emptyset 1}$, $R_{1\emptyset}$, $R_{11}$ is determined by which of the select lines S−1, S, S+1 is activated.

Only one of the select lines S−1, S, S+1 is activated (i.e., has a high, "1", signal applied) at a given time. Therefore, for example, when select line S is high, read line $R_{\emptyset\emptyset}$ is enabled to read the contents of storage cell S($\emptyset\emptyset$), read line $R_{\emptyset 1}$ is enabled to read the contents of storage cell S($\emptyset 1$), read line $R_{1\emptyset}$ is enabled to read the contents of storage cell S($1\emptyset$), and read line $R_{11}$ is enabled to read the contents of storage cell S(11).

In a superscalar computing application, according to the preferred embodiment of the present invention, instructions are fetched in fetch-batches of four instructions at a time. If the first instruction of a fetch-batch is stored in a storage cell having an address with its least-significant bits being $\emptyset\emptyset$, then the remaining cells in the same respective row 14, 16, 18 as the first instruction are selected in a fetch-batch. This is a normally anticipated situation in executing instructions in a superscalar computer apparatus.

There are occasions, however, when a jump instruction or other requirement necessitates the beginning of a fetch-batch at a storage cell having an address with its two least-significant bits being other than $\emptyset\emptyset$. For example, a jump instruction within a program may require that the next subsequent instruction to be fetched for execution by the superscalar computing apparatus be fetched from a storage cell having an address with its two least-significant bits being $1\emptyset$. In such a situation, with the prior art device illustrated in FIG. 1, the fetch-batch will begin, for example, with select line S being activated and the fetch-batch will consist of instructions from storage cells S($1\emptyset$) and S(11). The fetch-batch will, therefore, consist of only two instructions, and the capability to fetch four instructions will be only 50% utilized. The activation of select line S normally enables fetching of the four instructions contained in row 16: S($\emptyset\emptyset$), S($\emptyset 1$), S($1\emptyset$), and S(11). However, since the fetch began at storage cell S($1\emptyset$), the two preceding storage cells S($\emptyset\emptyset$) and S($\emptyset 1$) are wasted or "thrown away". This result occurs because the prior art storage cell structure of FIG. 1 provides that activation of a given select line S−1, S, S+1 enables a read of storage cell contents only from a single row 14, 16, 18. There is no capability of the prior art storage cell illustrated in FIG. 1 to "wrap around" and read the contents from next-succeeding storage cells from another row (such as S+1($\emptyset\emptyset$) and S+1($\emptyset 1$)) in order to fully utilize the four instruction fetch capability.

Such a limitation is a serious problem in a superscalar computing apparatus since the limitation is an inherent inefficiency in the fetching of instructions which is imposed by the very architecture of the instruction storing device.

Figure 2:
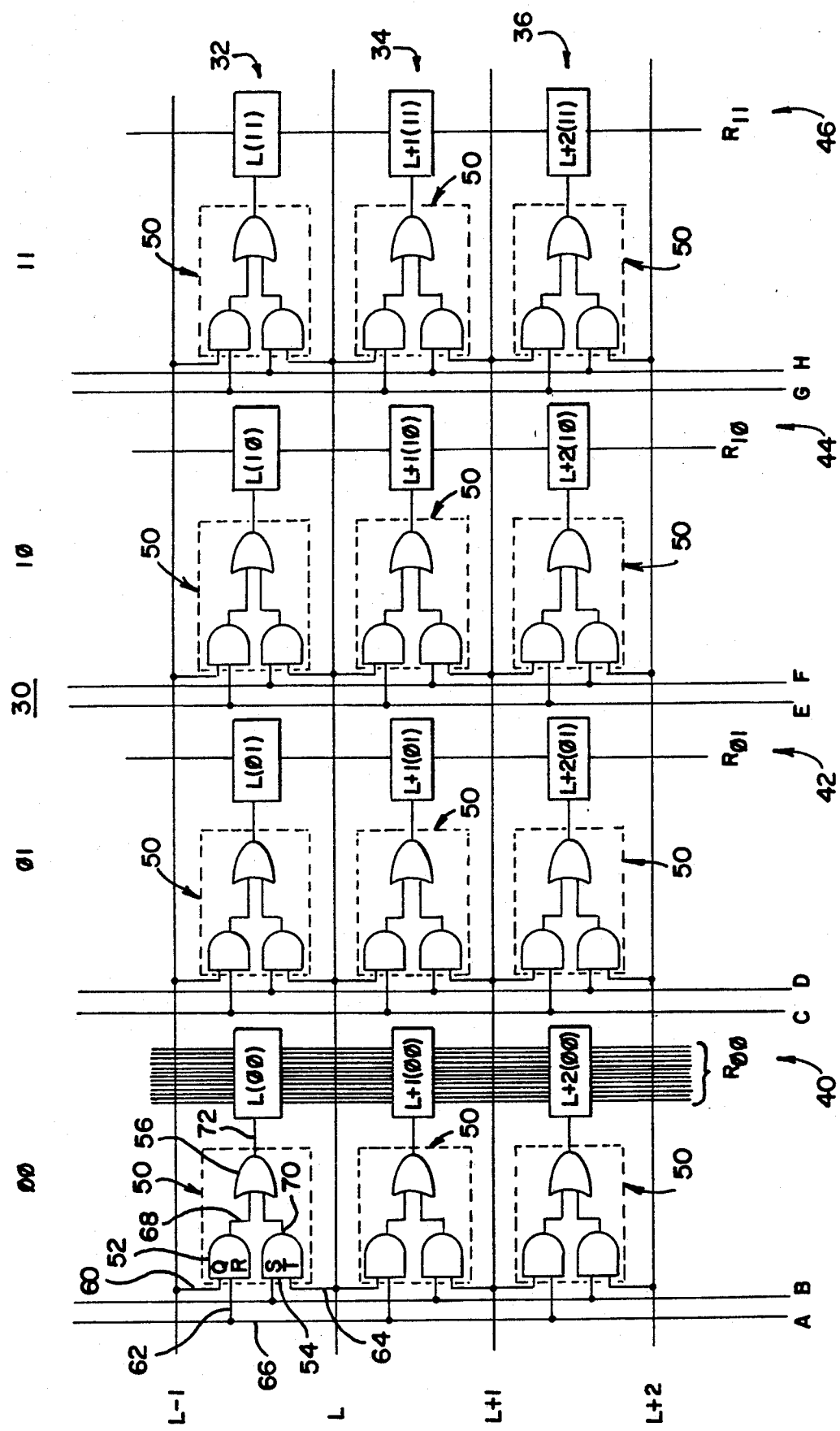
FIG. 2 is an electrical schematic drawing of the preferred embodiment of the present invention showing a respective three-row, four-column matrix of storage cells.

FIG. 2 is an electrical schematic drawing of the preferred embodiment of the present invention showing a representative three-row, four-column matrix of storage cells.

In FIG. 2, a storage device 30 is shown having a matrix construction comprising rows 32, 34, 36 and columns 40, 42, 44, 46. Row select lines are associated with each row so that row select line L is associated with row 32, row select line L+1 is associated with row 34, and row select line L+2 is associated with row 36. Row select line L−1 is associated with a row (not shown) above row 32 in FIG. 2.

In each row, column intersection, there is situated a storage cell, each of which storage cells is identified by an address comprised of a plurality of binary bits. The bits of each respective storage cell address are arranged in order of significance and the columns 40, 42, 44, 46 represent an arrangement of respective storage cells according to the two least-significant bits of their respective addresses. Thus, column 40 is associated with storage cells having an address with its two least-significant bits being $\emptyset\emptyset$, column 42 is associated with storage cells having an address with its two least-significant bits being $\emptyset 1$, column 44 is associated with storage cells having an address with its two least-significant bits being $1\emptyset$, and column 46 is associated with storage cells having an address with its two least-significant bits being 11.

Accordingly, each respective storage cell may be identified by its associated row select line and the two least-significant bits of its address: column 40 contains storage cells L($\emptyset\emptyset$), L+1($\emptyset\emptyset$), and L+2($\emptyset\emptyset$); column 42 contains storage cells L(∅1), L+1(∅1), and L+2(∅1); column 44 contains storage cells L(1∅), L+1(1∅), and L+2(1∅); and column 46 contains storage cells L(11), L+1(11), and L+2(11).

Read lines R$_{∅∅}$, R$_{∅1}$, R$_{1∅}$, and R$_{11}$ are, respectively, associated with columns 40, 42, 44, 46 so that read line R$_{∅∅}$ may read any of the storage cells having an address with its two least-significant bits being ∅∅, read line R$_{∅1}$ may read the contents of any of the storage cells having an address with its two least-significant bits being ∅1, read line R$_{1∅}$ may read the contents of any of the storage cells having an address with its two least-significant bits being 1∅, and read line R$_{11}$ may read the contents of any of the storage cells having an address with its two least-significant bits being 11. The determination as to which storage cell in a given column 40, 42, 44, 46 is read by a respective read line R$_{∅∅}$, R$_{∅1}$, R$_{1∅}$, R$_{11}$ is determined by which of the select lines L−1, L, L+1, L+2 is activated.

Only one of the row select lines L−1, L, L+1, L+2 is activated, (i.e., has a high, "1". signal applied) at a given time. Which of the row select lines L−1, L, L+1, L+2 is activated is determined by selected of the address bits of the storage cells which are of higher significance than the two least-significant address bits.

Column designation lines A, B, C, D, E, F, G, H are associated with the columns 40, 42, 44, 46 in order to designate specific storage cells within the matrix. Specifically, column designation lines A, B may be employed to effect designation of storage cells having least-significant address bits ∅∅; column designation lines C, D may be employed to designate storage cells having least-significant address bits ∅1; column designation lines E, F may be employed to designate storage cells having least-significant address bits 1∅; and column designation lines G, H may be employed to designate storage cells having least-significant address bits 11.

Each of the storage cells L(∅∅)−L+2(11) has an associated interface circuit 50. As indicated in detail in connection with the interface circuit 50 associated with storage cell L(∅∅), each storage cell 50 is comprised of AND gates 52, 54 and OR gate 56. AND gate 52 has an input 60 which is connected to the next lower row select line L−1 and an input 62 which is connected to a first of the column designation lines A associated with least-significant address bits ∅∅. AND gate 54 has an input 64 which is connected to the next higher row select line L and an input 66 which is connected to a second row designation line B associated with least-significant address bits ∅∅. AND gate outputs 68 and 70 are received as inputs by OR gate 56. OR gate output 72 is applied to storage cell L(∅∅). A high, or "1", signal on OR gate output 72 effects operative connection of read lines R$_{∅∅}$ with storage cell L(∅∅) to enable access to the information contained in storage cell L(∅∅).

Each interface circuit 50 electrically embodies the logic statement (Q∩S)∪(S∩T), where Q is associated with AND gate input 60, R is associated with AND gate input 62, S is associated with AND gate input 66, and T is associated with AND gate input 64.

According to a predetermined arrangement, column designation lines A, B, C, D, E, F, G, H, are activated with a "1" signal in response to the least-significant address bits of a storage cell L(∅∅)−L+2(11) according to Table 1 below. The right hand column of Table 1 indicates the storage cells selected for readout when row select line L is enabled with a "1" signal.

TABLE 1

| ADDRESS LSB* | A | B | C | D | E | F | G | H | CELLS SELECTED WHEN SELECT LINE L IS "1" |
|---|---|---|---|---|---|---|---|---|---|
| 00 | 0 | 1 | 0 | 1 | 0 | 1 | 0 | 1 | L(00), L(01), L(10), L(11) |
| 01 | 1 | 0 | 0 | 1 | 0 | 1 | 0 | 1 | L(01), L(10), L(11), L+1(00) |
| 10 | 1 | 0 | 1 | 0 | 0 | 1 | 0 | 1 | L(10), L(11), L+1(00), L+1(01) |
| 11 | 1 | 0 | 1 | 0 | 1 | 0 | 0 | 1 | L(11), L+1(00), L+1(01), L+1(10) |

*LSB = Least-significant bits

Thus, by way of example, if the first instruction of a fetch-batch of four instructions is contained in a storage cell in row 32 having least-significant address bits 1∅, then column designation lines A-H will be assigned values as indicated in the third line of the above table. Further, by enabling row select line L with a "1" signal, the logical statement (Q∩R)∪(S∩T) is satisfied for the storage cells L(1∅), L(11), L+1(∅∅), and L+1(∅1).

In such manner the present invention allows access to two rows in the matrix of the apparatus 30 by enablement of a single row select line, and the logical treatment of the predetermined activation of column designation lines A-H in response to the least-significant address bits of the first instruction of a fetch-batch ensures full utilization of the four instruction fetch capability of an associated superscalar computing device (not shown). Further, the logical treatment of the enablement of a row select line and its predetermined signal response on the various column designation lines A-H ensures that four consecutive instructions are read, beginning with the designated first instruction of the fetch-batch.

FIG. 3 is an electrical schematic diagram of an alternate embodiment of the interface circuit of the present invention.

In FIG. 3, an alternate embodiment of an interface circuit 51 is comprised of AND gate 100, AND gate 102, OR gate 104, and inverter 106. AND gate 100 has an input 108 which is intended for connection to the next lower row select line, and an input 110 which is connected to the output of inverter 106. The input 111 of inverter 106 is connected to column designation line J so that the input 110 to AND gate 100 represents the inverse of the signal present on column designation line J. AND gate 102 has an input 112 which is connected to the input 111 of inverter 106 so that input 112 to AND gate 102 is a noninverted representation of the signal present on column designation line J. AND gate 102 has a second input 114 which is intended for connection to the next higher row select line associated with the interface circuit. The output 116 of AND gate 100 and the output 118 of AND gate 102 are applied as inputs to OR gate 104.

By the structure illustrated in FIG. 3, the output 120 of OR gate 104 represents the logic statement (W∩X)∪(Y∩Z). W and X are associated with inputs 108 and 110, respectively, of AND gate 100; Y and Z are associated with inputs 112 and 114, respectively, of AND gate 102.

Inspection of Table 1 reveals that at no time are any of the designation line pairs A-B, C-D, E-F, or G-H the same value. Stated another way, each of those designation line pairs A-B, C-D, E-F, G-H is mutually inverse. It is this characteristic of the predetermined arrangement of Table 1 that enables the use of alternate interface circuit 51 to effect the same logical result as occurs when using preferred interface circuit 50.

The prearranged relationship between column designation lines J, K, L, M and the two least-significant bits of storage cell addresses appropriate to interface circuit 51 is reflected in Table 2 below.

TABLE 2

| ADDRESS LSB* | DESIGNATION LINE | | | | CELLS SELECTED WHEN SELECT LINE L IS "1" |
|---|---|---|---|---|---|
| | J | K | L | M | |
| 00 | 0 | 0 | 0 | 1 | L(00), L(01), L(10), L(11) |
| 01 | 1 | 0 | 0 | 1 | L(01), L(10), L(11), L+1(00) |
| 10 | 1 | 1 | 0 | 1 | L(10), L(11), L+1(00), L+1(01) |
| 11 | 1 | 1 | 1 | 1 | L(11), L+1(00), L+1(01), L+1(10) |

*LSB = Least-significant bits

Designation line J is, in this embodiment of the invention, related to the least-significant address bits in the same manner as designation line A in Table 1. Similar correspondence of predetermined relationship occurs between designation line K in Table 2 and designation line C in Table 1, designation line L in Table 2 and designation line E in Table 1, and designation line M in Table 2 and designation line G in Table 1. The predetermined arrangement between designation lines and least-significant address bits of Table 2 yields precisely the same cell selection result as the predetermined arrangement reflected in Table 1, as indicated by the third column of Table 2.

It is to be understood that, while the detailed drawings and specific examples given describe preferred embodiments of the invention, they are for the purpose of illustration only, that the apparatus of the invention is not limited to the precise details and conditions disclosed and that various changes may be made therein without departing from the spirit of the invention which is defined by the following claims:

I claim:

1. An information storage apparatus comprising:
   a plurality of storage cells, said plurality of storage cells being operatively arranged in a matrix having rows and columns;
   an array of first conductor means for conveying a first selection signal to said rows;
   an array of second conductor means for conveying a second selection signal to said columns;
   a plurality of read means for enabling reading of the contents of said plurality of storage cells; and
   a respective interface circuit associated with each respective storage cell of said plurality of storage cells for selectively effecting operative read connection of said respective storage cell with appropriate respective read means on said plurality of read means;
   selected first conductor means of said array of first conductor means being operatively connected to convey said first selection signal to at least two said rows;
   each said respective interface circuit being responsive to said first selection signal and to said second selection signal to effect said operative read connection.

2. An information storage apparatus as recited in claim 1 wherein said second selection signal is established according to a predetermined arrangement with respect to said first selection signal.

3. An information storage apparatus as recited in claim 1 or claim 2 wherein said first selection signal determines a first set of cells of said plurality of storage cells; and said operative read connection is effected with a predetermined number of cells of said first set of cells.

4. An information storage apparatus as recited in claim 3 wherein each of said plurality of storage cells has an address, said address being expressed in a plurality of information segments, at least one of said plurality of information segments comprising said first selection signal.

5. An information storage apparatus as recited in claim 2 wherein each of said plurality of storage cells has a four-bit address; said first selection signal enabling one first conductor means of said array of first conductor means according to the two most-significant bits of said address; said first selection signal determining a first set of cells of said plurality of storage cells according to the two least-significant bits of said address; said operative read connection being effected with a predetermined number of cells of said first set of cells.

6. An information storage apparatus having a plurality of storage cells, the apparatus comprising:
   a plurality of first select means for effecting a first selection of a first array of said plurality of cells;
   a plurality of second select means for effecting a second selection of at least one specific cell among said first array of said plurality of cells;
   a plurality of read means for enabling reading of contents of said plurality of cells; and
   a plurality of interface means for effecting operative connection of said at least one specific cell to appropriate respective read means of said plurality of read means;
   said plurality of interface means being selectively operatively connected to said plurality of first select means and said plurality of second select means according to a predetermined arrangement;
   each of said plurality of interface means comprising two AND gates and an OR gate; each of said two AND gates receiving one input from different ones of said plurality of first select means; each of said two AND gates receiving another input from different ones of said plurality of second select means; said OR gate receiving as inputs the outputs of said two AND gates; the output of said OR gate being operatively connected for effecting said operative connection of said respective storage cell to said appropriate read means.

7. An information storage apparatus having a plurality of storage cells, the apparatus comprising:
   a plurality of first select means for effecting a first selection of a first array of said plurality of cells;
   a plurality of second select means for effecting a second selection of at least one specific cell among said first array of said plurality of cells;
   a plurality of read means for enabling reading of contents of said plurality of cells; and
   a plurality of interface means for effecting operative connection of said at least one specific cell to appropriate respective read means of said plurality of read means;

said plurality of interface means being selectively operatively connected to said plurality of first select means and said plurality of second select means according to a predetermined arrangement;

said plurality of interface means comprising one interface means associated with each respective storage cell of said plurality of storage cells;

each of said plurality of interface means comprising two AND gates and an OR gate; each of said two AND gates receiving one input from different ones of said plurality of first select means; each of said two AND gates receiving another input from different ones of said plurality of second select means; said OR gate receiving as inputs the outputs of said two AND gates; the output of said OR gate being operatively connected for effecting said operative connection of said respective storage cell to said appropriate read means.

8. An information storage apparatus as recited in claim 7 wherein each of said plurality of cells has an address, said address being expressed in a plurality of information segments;

said first selection being determined by a first segment set of said plurality of information segments; and said second selection being determined by a second segment set of said plurality of information segments.

9. An information storage apparatus comprising:

a plurality of storage cells, said plurality of storage cells being operatively arrayed in a matrix, said matrix having at least one row and at least one column;

a plurality of first select means for effecting a first selection of at least one designated row of said at least one row;

a plurality of second select means for effecting a second selection of at least one specific storage cell among said at least one designated row;

a plurality of read means for enabling reading of contents of said plurality of storage cells; and a plurality of interface means for effecting operative connection of said at least one specific storage cell to appropriate respective read means on said plurality of read means;

each of said plurality of storage cells having an associated interface means of said plurality of interface means, each of said associated interface means being selectively operatively connected to said plurality of first select means and said plurality of second select means according to a predetermined arrangement;

each of said plurality of interface means comprising two AND gates and an OR gate; each of said two AND gates receiving one input from different ones of said plurality of first select means; each of said two AND gates receiving another input from different ones of said plurality of second select means; said OR gate receiving as inputs the outputs of said two AND gates; the output of said OR gate being operatively connected for effecting said operative connection of said respective storage cell to said appropriate read means.

10. An information storage apparatus as recited in claim 7 wherein said at least one specific storage cells is four storage cells.

11. An information storage apparatus as recited in claim 9 or claim 10 wherein each of said plurality of storage cells has an address, said address being expressed in a plurality of information segments;

said first selection is determined by a first segment set of said plurality of information segments; and said second selection is determined by a second segment set of said plurality of information segments.

12. An information storage apparatus as recited in claim 11 wherein said plurality of information segments comprises a plurality of binary bits, said plurality of binary bits being arrayed in order of significance.

13. An information storage apparatus as recited in claim 12 wherein said first segment set is of a higher order of significance than said second segment set.

* * * * *